United States Patent [19]

Nakashima et al.

[11] Patent Number: 5,210,441
[45] Date of Patent: May 11, 1993

[54] LEAD FRAME FORMED OF A COPPER-ZIRCONIUM ALLOY

[75] Inventors: Nobuaki Nakashima; Shinzo Sugai, both of Tokyo, Japan

[73] Assignee: Kabushiki Kaisha Toshiba, Kawasaki, Japan

[21] Appl. No.: 810,426

[22] Filed: Dec. 20, 1991

[30] Foreign Application Priority Data

Dec. 20, 1990 [JP] Japan .................. 2-404416

[51] Int. Cl.⁵ .......................... H01L 23/54
[52] U.S. Cl. ..................... 257/677; 257/741
[58] Field of Search ............... 357/70, 68, 80; 437/217, 220; 148/411, 412

[56] References Cited

U.S. PATENT DOCUMENTS

| | | | |
|---|---|---|---|
| 4,589,930 | 5/1986 | Kumaga | 148/411 |
| 4,640,723 | 2/1987 | Sugai et al. | 148/411 |
| 4,755,235 | 7/1988 | Matidori et al. | 148/411 |

FOREIGN PATENT DOCUMENTS

| | | | |
|---|---|---|---|
| 58-141544 | 8/1983 | Japan | 357/70 |
| 59-193233 | 11/1984 | Japan . | |
| 62-2559 | 1/1987 | Japan | 357/70 |
| 1-189947 | 7/1989 | Japan | 357/70 |

Primary Examiner—Rolf Hille
Assistant Examiner—S. V. Clark
Attorney, Agent, or Firm—Foley & Lardner

[57] ABSTRACT

A lead frame comprising a copper alloy containing 0.1 to 1 % by weight of chromium, 0.01 to 0.5% by weight of zirconium and having partial discolored regions caused by unbalanced precipitation of the zirconium distributed thereon at a rate of 2 grains/100 $cm^2$ or less. The lead frame is, for example, obtained by an alloy containing 0.005% by weight of sulphur or less. The lead frame has an high reliability, high yield of production and high electrical conductivity.

14 Claims, 7 Drawing Sheets

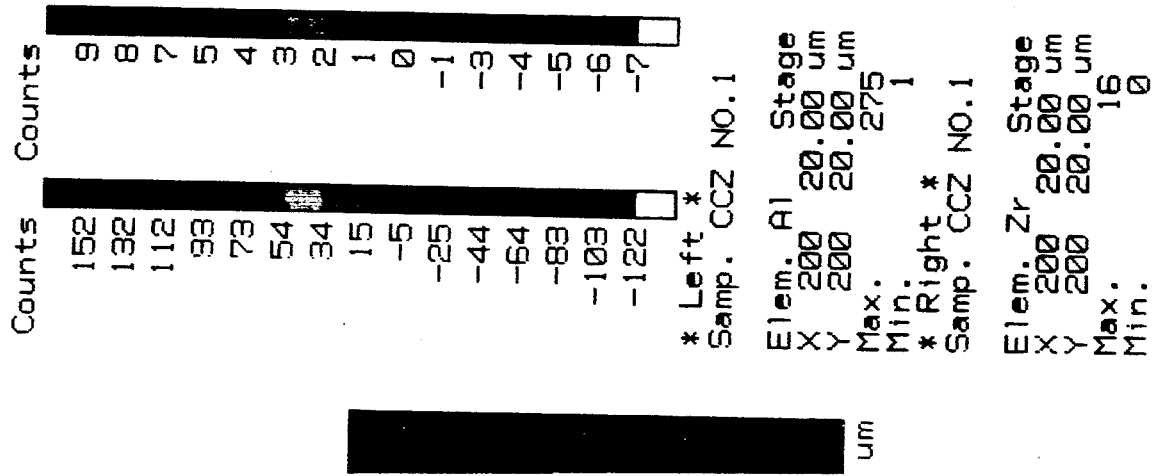

LEAD FRAME FORMED OF A COPPER-ZIRCONIUM ALLOY

BACKGROUND OF THE INVENTION

The present invention relates to a lead frame and a material of the same made of a Cu alloy.

Recently, the improvement of materials used for integrated circuits (IC) has made rapid progress, allowing highly integrated and mass-produced IC. In many fields, both material and components are required to be further improved because of the concern about properties and price.

For example, a lead frame made of a Fe-Ni alloy such as 42wt%Ni-Fe or 29wt%Ni-17wt%Co-Fe has a coefficient of thermal expansion very similar to that of the semiconductor element.

However, a lead frame made of a Fe alloy is expensive because expensive components such as nickel and cobalt are used. In addition, a lead frame made of a Fe alloy doesn't satisfy the requirements of high radiation, that is, thermal conductivity, which is required as semiconductors become highly integrated.

Accordingly, lead frames made of a Cu alloy are chiefly being used because of the property of high radiation and relative inexpensiveness. In such lead frames made of a Cu alloy, Cu-Cr-Zr alloy is especially being used because of its high hardness and high conductivity.

However, the lead frame made of a Cu-Cr-Zr alloy as described above often has a peeling part on the surface of the lead frame, and a plating scab caused by heat treatment when the surface is coated. When an IC package or a LSI package with a lead frame of Cu-Cr-Zr alloy is made, because of the problems as described above, the yield of production and the reliability of these packages of a Cu-Cr-Zr alloy are impaired. Furthermore, a Cu-Cr-Zr alloy as described above is required to have high conductivity with a good producibility, for example not less than 75IACS%, for the high efficiency of a lead frame.

SUMMARY OF THE INVENTION

In view of this problem, the present inventors have made extensive studies, and found that the problems such as peeling parts on the surface of the lead frame and a scab on the lead frame caused by heat treatment when being plated and the like are due to the number of partial discolored regions, and further more, the partial discolored regions are due to the unbalanced precipitation of Zr.

The present invention has been made based on this finding and has for its object to provide a lead frame and a material of the same which has a high conductivity and which makes it possible to produce a highly reliable IC package or a LSI package and the like with a high yield of production.

A lead frame material of the present invention comprises a copper alloy which contains 0.1 to 1% by weight of Cr, 0.01 to 0.5% by weight of Zr and having a partial discolored regions caused by unbalanced precipitation of the Zr distributed thereon at a rate of 2 grains/100cm$^2$ or less.

BRIEF DESCRIPTION OF THE DRAWINGS

FIGS. 4A to 4H are the results of EPMA analysis of Al, Zr, S, C, P, O, Si and Cr, respectively.

DETAILED DESCRIPTION OF THE PREFERRED EMBODIMENTS

Figure 1:
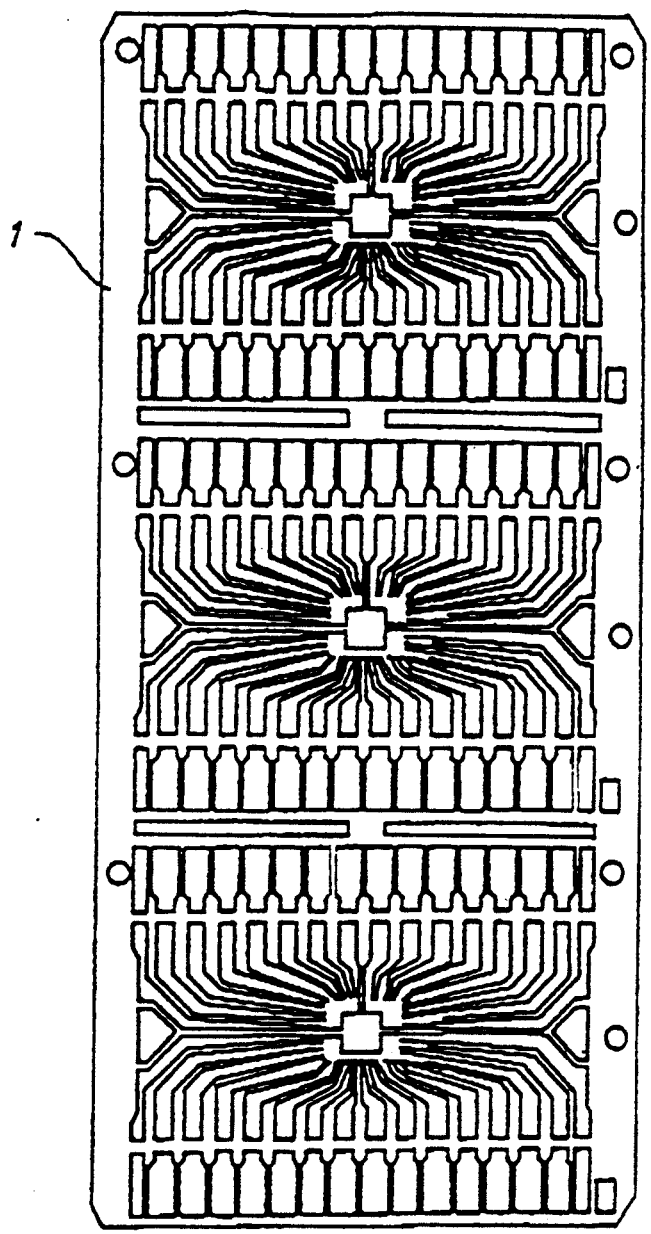
FIG. 1 is a plan view of a lead frame according to an embodiment of the present invention.

The number of partial discolored regions caused by unbalanced precipitation of Zr is very important in the present invention.

If the number of partial discolored regions caused by unbalanced precipitation of Zr is 2 grains/100cm$^2$ or less, the problems such as plating scabs on the lead frame caused by heat treatment are improved, which makes it possible to produce a highly reliable IC package or LSI package and the like with a high yield of production. The number of these partial discolored regions is preferably 1 grain/100cm$^2$ or less. The number of partial discolored regions is more preferably zero. The phrase "partial discolored regions caused by unbalanced precipitation of Zr" means a region which has a different color from other regions, and which is observed by microphotograph. The region is usually belt-shaped. The partial discolored region is normally an independent region.

The partial discolored region caused by unbalanced precipitation of Zr, as described above, depends on the sulphur content. Consequently, it is important to contain sulphur, which is an impurity in the alloy, to less than 0.005% by weight. If the sulphur content is less than 0.005% by weight, the number of partial discolored regions caused by unbalanced precipitation of Zr is 2 grains/100cm$^2$ or less. The value of the region described above is preferably less than 0.004% by weight. The value of the region described above is more preferably less than 0.003% by weight. In addition, the number of partial discolored regions caused by unbalanced precipitation of Zr is also influenced by the injection method of the Zr. So adding Zr as the matrix alloy of Cu-Zr is preferable to reduce their formation, as described above.

The basic composition of the Cu alloy of the present invention is determined by the following reasons.

If the Cr content is 0.1% by weight or more, the mechanical strength and heat resistance of the alloy are increased. This effect is maintained without impairing the bending strength and electrical conductivity of the alloy until the Cr content reaches 1% by weight. The value of the Cr content is preferably in the range from 0.2-0.6 by weight. The value of the Cr content is more preferably in the range from 0.2-0.5 by weight.

If the Zr content is 0.01% by weight or more the mechanical strength and heat resistance of the alloy are increased. This effect is maintained without impairing the bending strength and electrical conductivity of the alloy until the Zr content reaches 0.5% by weight. The value of the Zr content is preferably in the range from 0.05-0.3 by weight. The value of the Zr content is more preferably in the range from 0.05-0.25 by weight.

The lead frame material of the present invention preferably has high electrical conductivity, which is not less than 75IACS%. If the conductivity is 75IACS% or more, we can get a highly efficient lead frame for use with a highly integrated semiconductor element. The electrical conductivity of the lead frame is preferably 80IACS% or more. The electrical conductivity of the lead frame is more preferably 85IACS% or more.

In order to get a lead frame with high electrical conductivity, the impurities in the alloy components are preferably less than 0.05% by weight of Fe, less than 0.1% by weight of Ni, less than 0.05% by weight of P, less than 0.1% by weight of Sn and less than 0.1% by weight of Zn. The effects mentioned above are maintained without impairing the electrical conductivity of the alloy, so long as all of these impurities are contained in the range described above. The content of each of these elements is preferably less than 0.05% by weight of Ni, less than 0.03% by weight of P, less than 0.05% by weight of Sn and less than 0.05% by weight of Zn.

The lead frame and the material of the same of the present invention are improved if the following conditions are met.

First of all, the peeling part on the surface of the lead frame is preferably 5 grains/coil or less. If an IC package or a LSI package is produced using a lead frame with a peeling part on the surface of the lead frame of more than 5 grains/coil, a highly reliable package is not obtained, because of impairment of the yield production caused by the peeling parts.

Accordingly, the value of the peeling part is preferably not more than 3 grains/coil, and the value of the peeling part is more preferably zero. The term "peeling part" means the condition when a portion of the surface peels linearly from the surface of the lead frame.

Second, a plating scab caused by heat treatment at the time of coating on the surface of the lead frame should not appear.

If the IC package or the LSI package is produced by the lead frame using the same lot which has a plating scab caused by the heat treatment, a highly reliable package is not obtained because of the high possibility of producing a plating scab at the time of use. The term "plating scab" means a convex part which seems to be swollen up from the plating face.

They are detected by confirming the flatness of the plated face after performing plating, and thereafter by observing the surface by stereomicroscope ($\times 20$) after performing hot working at 350° C. for 5 minutes.

Third, the Vickers hardness of the lead frame is preferably 150Hv or more.

If the Vickers hardness is not less than 150Hv a highly reliable package having sufficient hardness is produced. The value of the Vickers hardness is preferably not less than 160Hv. The value of the Vickers hardness is more preferably not less than 170Hv.

Thus, according to the present invention, high hardness and high electrical conductivity can be obtained. Moreover, the yield of production and the reliability can be improved.

EXAMPLES

The present invention will now be described by way of examples.

EMBODIMENT 1-20

First, Cu alloy having the compositions as shown in Table-1 were prepared by casting after smelting under vacuum in the carbon crucible and an ingot was produced. Hot forging after heating to about 900° C. was then performed in order to form each ingot to a billet having a thickness of about 150mm and a width of about 450mm. Next, hot rolling after heating to about 950° C. was then performed in order to form each billet to a hot coil having a thickness of about 13mm and a width of about 450mm. After performing hot working at 750 to 800° C., in conclusion, a solution treatment was performed by rapid cooling.

After grinding the surface of the hot coil performed by the rapid cooling, as described above, cold rolling was then performed to roll each alloy to a plate having a thickness of about 2mm, and middle annealing was then performed to those coils at about 450° C. for 6 hours. After that, surface polishing was performed, and then after performing cold rolling to roll each alloy to a plate having a thickness of 0.25mm, age-hardening at about 450° C. for 6 hours was performed to obtain the lead frame.

As the surface condition of the lead frames having the compositions of sample Nos.1 to 20 obtained in this manner, the number of partial discolored regions were investigated in the range of 10cm × 10cm, and the average value of them was measured at 10 different ranges. Table-2 shows the results of the above mentioned evaluation. In addition, the Vickers hardness of the samples was measured, and the electrical conductivities were calculated by measuring relative resistance (at the normal temperature) using the four terminal method. Moreover, the number of peeling parts of about 2 tons of coils by weight were measured.

Figure 3:
FIG. 3 is a microphotograph ($\times$32) of a lead frame which has plating scabs caused by heat treatment.

The each plate was punched to prepare a lead frame of a shape as shown in FIG. 1. By using each of these lead frames, the presence of the plating scabs caused by heating treatment (the scab means convex part which seems to be swollen up from the plating face) was decided by confirming the flatness of plated face after performing Ag plating, and thereafter by observing the surface by stereomicroscope ($\times 20$) after performing hot working at 350° C. for 5 minutes in an air atmosphere. The plating scab caused by heat treatment was examined in each of twenty frames for each sample, and the number of frames having the plating scabs is shown for each sample in Table-2. Table-2 also shows the plating scab evaluation results. FIG. 3 is a microphotograph ($\times 32$) of a lead frame which has plating scabs caused by heat treatment.

In addition, as comparison examples, lead frames made of conventional Cu alloys (which composition is shown in Table-1) were also evaluated similarly. Table-2 also shows the evaluation results.

As clearly shown in Table-2, when the content of sulphur in each material is less than 0.005% by weight, the partial discolored regions on the surface of the lead frame are few. Thus, the peeling parts and the plating scabs caused by heat treatment and the like are fewer compared with the comparative examples with many partial discolored regions. This result contributes to improve the yield of production and reliability of the IC package and the like. In addition, it is found that keeping high conductivity is also achieved with a good reappearance, because of the content of impurities such as, Fe, Ni and the like are at a low level respectively.

Moreover, from the view of Vickers hardness, lead frames with high hardness can be obtained which correspond to high efficiency.

The surface of the lead frame of the comparative example having many partial discolored regions was observed by scanning electron microscope (JSM-T300, made by Japan Electron Optics Laboratory & Co.,Ltd.; accelerated voltage 10KV, magnification 56.25 on the photograph).

Figure 2:
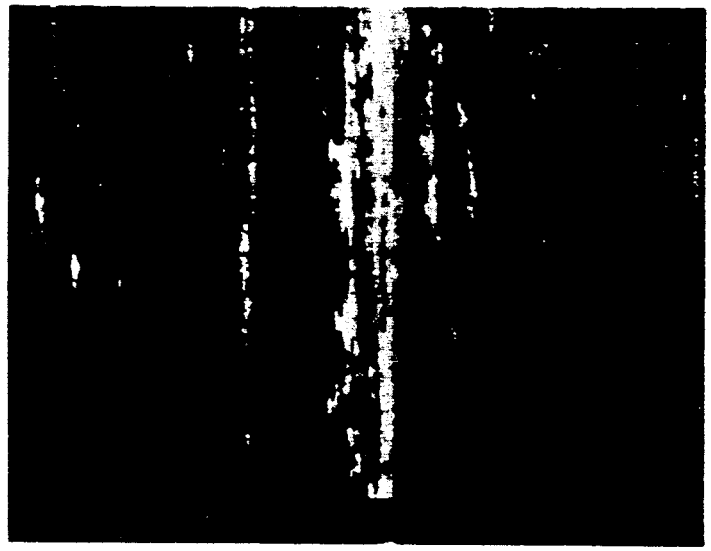
FIG. 2 is a typical view showing the microphotograph taken by an scanning electron microscope of a surface of a lead frame according to a comparative example of the present invention.
Figure 4D:
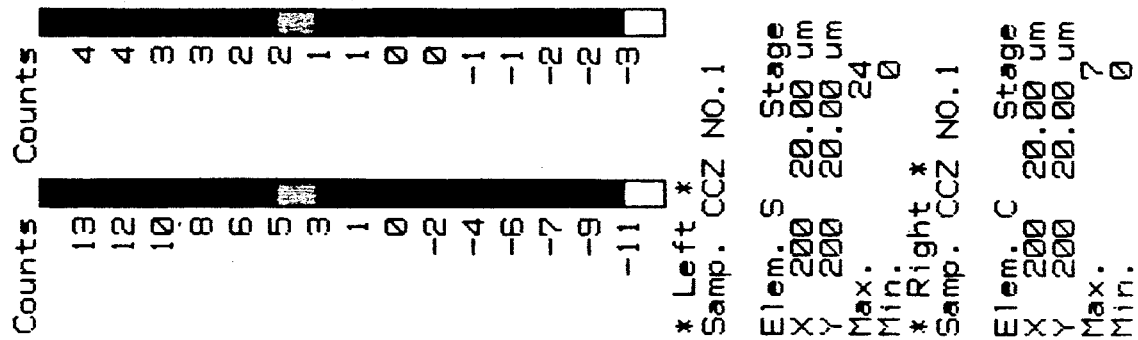
Figure 4D:
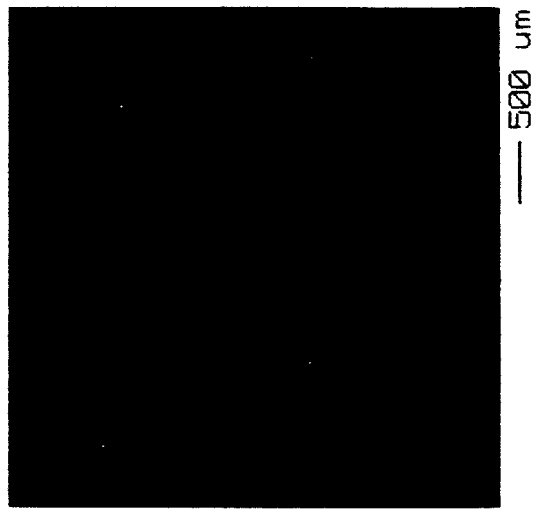
Figure 4C:
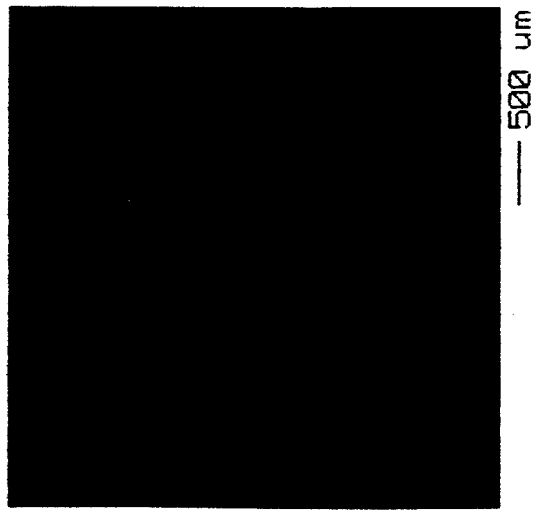
Figure 4F:
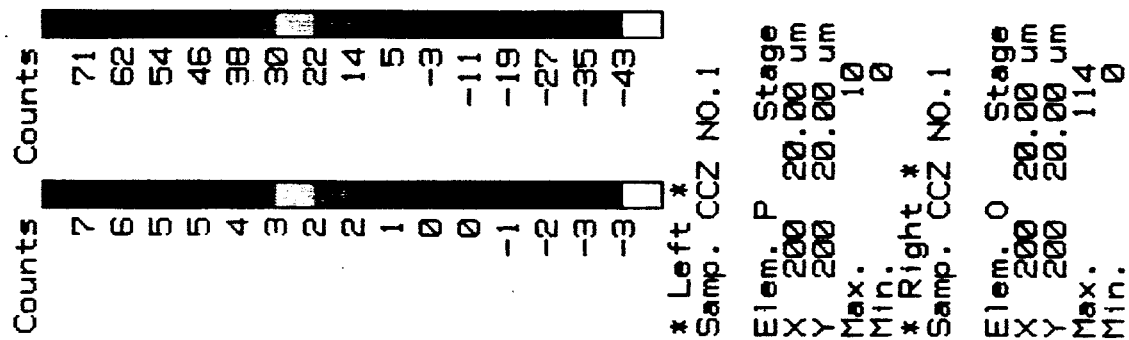
Figure 4F:
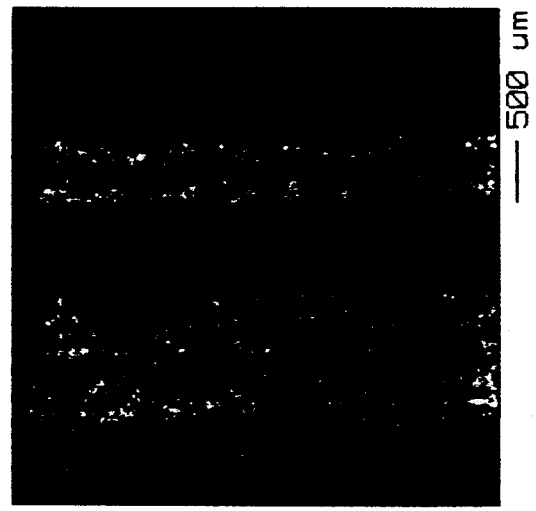
Figure 4E:
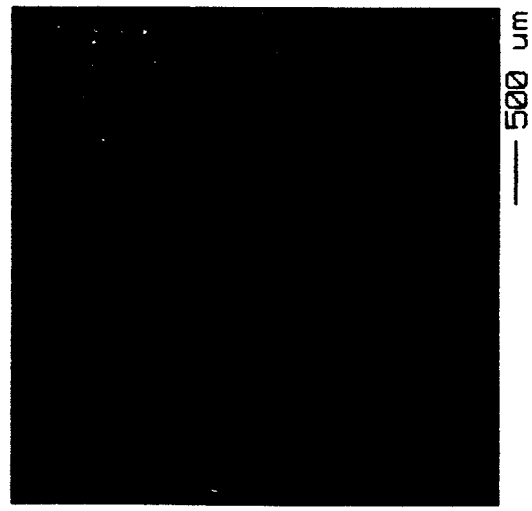
Figure 4H:
Figure 4H:
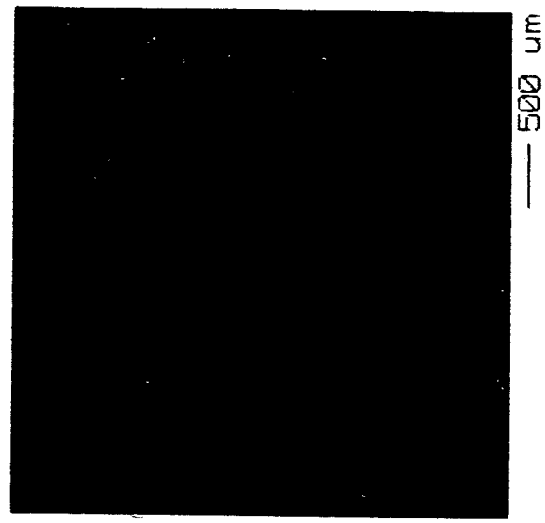
Figure 4G:
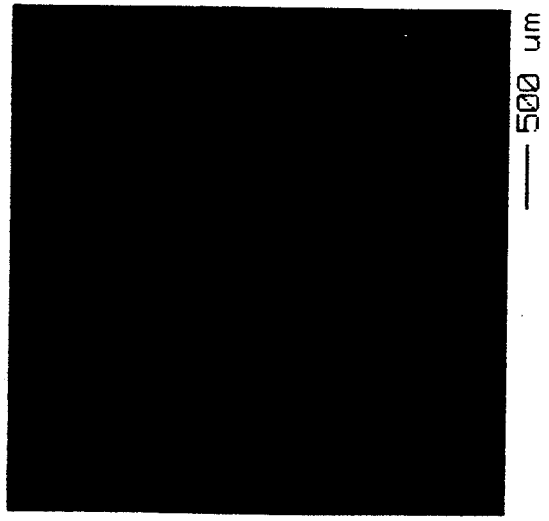

FIG. 2 shows the results of the observation as a typical figure of the scanning electron microphotograph. As shown in FIG. 2, the partial discolored region is part A has whitish vertical lines in the center The partial discolored region looks whitish by scanning electron microphotograph, since Zr on the surface is oxidized. Zr is easily oxidized in an air atmosphere because Zr is an active metal. The part A shaped line looks like a blackish line to the naked eye. Moreover, when the surface of the lead frame of the comparative example which has a partial discolored region was analyzed by electron probe microanalyser (EPMA, made by Japan Electron Optics Laboratory & Co.,Ltd.), Zr, S and O were detected from the partial discolored region. (See FIGS. 4B, 4B and 4F.)

The results of the analysis shows that unbalanced precipitation of Zr appeared at the part having enough S content, and the partial discolored region was caused by this unbalanced precipitation of Zr. On the other hand, outside the partial discolored region, neither Zr or S were detected. O was detected since Zr was oxidized after being exposed to an air atmosphere.

As described above, according to the lead frame of the present invention, excellent surface conditions are obtained, making it possible to prevent the deterioration of the yield of production of IC, LSI and the like caused by defects on the surface of the lead frame. In addition, the lead frame according to the present invention remarkably contributes to the improvement of the reliability.

The foregoing description and examples have been set forth merely to illustrate the invention and are not intended to be limiting. Since modifications of the described embodiments incorporating the spirit and substance of the invention may occur to persons skilled in the art, the scope of the invention should be limited solely with reference to the appended claims and equivalents.

TABLE 1

| | Alloy Component (wt %) | | | | | | | | |
|---|---|---|---|---|---|---|---|---|---|
| | Cr | Zr | S | Fe | Ni | P | Sn | Zn | Cu |
| Example | | | | | | | | | |
| 1 | 0.76 | 0.41 | 0.001 | 0.014 | 0.055 | 0.011 | 0.018 | 0.019 | balance |
| 2 | 0.54 | 0.28 | 0.002 | 0.029 | 0.061 | 0.023 | 0.014 | 0.009 | " |
| 3 | 0.32 | 0.14 | 0.001 | 0.005 | 0.046 | 0.031 | 0.021 | 0.005 | " |
| 4 | 0.22 | 0.09 | 0.001 | 0.004 | 0.024 | 0.004 | 0.006 | 0.002 | " |
| 5 | 0.36 | 0.20 | 0.0007 | 0.015 | 0.020 | 0.014 | 0.011 | 0.022 | " |
| 6 | 0.41 | 0.15 | 0.0004 | 0.006 | 0.055 | 0.001 | 0.001 | 0.006 | " |
| 7 | 0.30 | 0.16 | 0.0001 | 0.009 | 0.018 | 0.018 | 0.009 | 0.018 | " |
| 8 | 0.33 | 0.13 | 0.0001 | 0.023 | 0.033 | 0.011 | 0.014 | 0.009 | " |
| 9 | 0.46 | 0.10 | 0.003 | 0.039 | 0.043 | 0.001 | 0.024 | 0.007 | " |
| 10 | 0.51 | 0.33 | 0.0001 | 0.014 | 0.018 | 0.007 | 0.009 | 0.006 | " |
| 11 | 0.32 | 0.11 | 0.0001 | 0.027 | 0.041 | 0.031 | 0.071 | 0.021 | " |
| 12 | 0.23 | 0.05 | 0.004 | 0.005 | 0.022 | 0.001 | 0.007 | 0.009 | " |
| 13 | 0.41 | 0.12 | 0.0003 | 0.010 | 0.015 | 0.005 | 0.021 | 0.002 | " |
| 14 | 0.31 | 0.10 | 0.0004 | 0.014 | 0.032 | 0.022 | 0.011 | 0.067 | " |
| 15 | 0.28 | 0.03 | 0.001 | 0.013 | 0.024 | 0.002 | 0.029 | 0.023 | " |
| 16 | 0.61 | 0.32 | 0.0007 | 0.006 | 0.052 | 0.004 | 0.030 | 0.005 | " |
| 17 | 0.92 | 0.07 | 0.0009 | 0.013 | 0.016 | 0.001 | 0.005 | 0.007 | " |
| 18 | 0.28 | 0.26 | 0.0008 | 0.016 | 0.014 | 0.023 | 0.018 | 0.035 | " |
| 19 | 0.45 | 0.15 | 0.003 | 0.032 | 0.056 | 0.022 | 0.021 | 0.019 | " |
| 20 | 0.24 | 0.08 | 0.001 | 0.004 | 0.045 | 0.012 | 0.014 | 0.006 | " |
| Comparative Example | | | | | | | | | |
| 1 | 0.34 | 0.18 | 0.006 | 0.026 | 0.020 | 0.012 | 0.210 | 0.084 | " |
| 2 | 0.28 | 0.10 | 0.008 | 0.098 | 0.033 | 0.031 | 0.068 | 0.162 | " |
| 3 | 0.46 | 0.23 | 0.007 | 0.044 | 0.013 | 0.073 | 0.117 | 0.024 | " |
| 4 | 0.61 | 0.32 | 0.008 | 0.021 | 0.136 | 0.022 | 0.067 | 0.023 | " |
| 5 | 0.22 | 0.08 | 0.009 | 0.081 | 0.056 | 0.019 | 0.029 | 0.006 | " |

TABLE 2

| | Partial discolored region (grains/100 cm$^2$) | Vickers Hardness (Hv) | Conductivity (IACS %) | Peeling part (grains/coil) | The number of frames having plating scab (/20 frames) |
|---|---|---|---|---|---|
| Example | | | | | |
| 1 | 0 | 181 | 81.2 | 3 | 0 |
| 2 | 1 | 168 | 82.5 | 0 | 0 |
| 3 | 0 | 171 | 84.3 | 1 | 0 |
| 4 | 0 | 172 | 89.4 | 0 | 0 |
| 5 | 0 | 158 | 83.1 | 1 | 0 |
| 6 | 0 | 164 | 90.2 | 0 | 0 |
| 7 | 0 | 175 | 82.0 | 0 | 0 |
| 8 | 0 | 176 | 84.0 | 0 | 0 |
| 9 | 0 | 165 | 88.6 | 0 | 0 |
| 10 | 0 | 172 | 82.4 | 0 | 0 |
| 11 | 0 | 178 | 82.0 | 0 | 0 |
| 12 | 1 | 158 | 91.1 | 1 | 0 |
| 13 | 0 | 169 | 85.0 | 0 | 0 |
| 14 | 0 | 180 | 83.0 | 0 | 0 |
| 15 | 0 | 154 | 90.8 | 0 | 0 |
| 16 | 0 | 174 | 79.2 | 0 | 0 |
| 17 | 0 | 163 | 83.6 | 1 | 0 |
| 18 | 0 | 171 | 82.8 | 0 | 0 |
| 19 | 2 | 165 | 84.1 | 1 | 0 |

TABLE 2-continued

|  | Partial discolored region (grains/100 cm²) | Vickers Hardness (Hv) | Conductivity (IACS %) | Peeling part (grains/coil) | The number of frames having plating scab (/20 frames) |
| --- | --- | --- | --- | --- | --- |
| 20 | 0 | 168 | 88.2 | 0 | 0 |
| Comparative Example |  |  |  |  |  |
| 1 | 7 | 167 | 69.3 | 11 | 4 |
| 2 | 9 | 162 | 71.4 | 15 | 3 |
| 3 | 7 | 170 | 68.6 | 12 | 5 |
| 4 | 10 | 182 | 67.5 | 10 | 4 |
| 5 | 8 | 165 | 72.3 | 8 | 5 |

What is claimed is:

1. A lead frame comprising a copper alloy containing 0.1 to 1% by weight of chromium, 0.01 to 0.5% by weight of zirconium and having partial discolored regions caused by unbalanced precipitation of the zirconium distributed thereon at a rate of 2 grains/100cm² or less.

2. A lead frame according to claim wherein the copper alloy contains less than 0.005% by weight of sulphur.

3. A lead frame according to claim wherein the copper alloy contains less than 0.05% by weight of iron, less than 0.1% by weight of nickel, less than 0.05% by weight of phosphorus, less than 0.1% by weight of tin and less than 0.1% by weight of zinc.

4. A lead frame according to claim wherein the conductivity of said copper alloy is not less than 75IACS%.

5. A lead frame according to claim 1, wherein a peeling part on the surface of the lead frame does not exceed more than 5 grains/coil.

6. A lead frame according to claim 1, wherein there is one or less plating scab caused by heat treatment.

7. A lead frame according to claim I, wherein the Vickers hardness of said lead frame is not less than 150 Hv.

8. A lead frame material comprising a copper alloy containing 0.1 to 1 % by weight of chromium, 0.01 to 0.5% by weight of zirconium and having partial discolored regions caused by unbalanced precipitation of the zirconium distributed thereon at a rate of 2 grains/100cm² or less.

9. A lead frame material according to claim 8, wherein the copper alloy contains less than 0.005% by weight of sulphur.

10. A lead frame material according to claim 8, wherein the copper alloy contains less than 0.05% by weight of iron, less than 0.1% by weight of nickel, less than 0.05% by weight of phosphorus, less than 0.1% by weight of tin and less than 0.1% by weight of zinc.

11. A lead frame material according to claim 10, wherein the conductivity of said copper alloy is not less than 75IACS%.

12. A lead frame material according to claim 8, wherein a peeling part on the surface of the lead frame does not exceed more than 5 grains/coil.

13. A lead frame material according to claim 8, wherein there is one or less plating scab caused by heat treatment.

14. A lead frame material according to claim 8, wherein the Vickers hardness of said lead frame is not less than 150 Hv.

* * * * *